United States Patent [19]

Busca et al.

[11] 4,405,905

[45] Sep. 20, 1983

[54] ATOMIC FREQUENCY STANDARD HAVING MICROWAVE LOOP AROUND ABSORPTION CELL

[75] Inventors: Giovanni Busca, Neuchatel; Leland Johnson, La Chaux-de-Fonds, both of Switzerland

[73] Assignee: Oscilloquartz S.A., Switzerland

[21] Appl. No.: 224,133

[22] Filed: Jan. 12, 1981

[30] Foreign Application Priority Data

Jan. 11, 1980 [CH] Switzerland ............... 204/80

[51] Int. Cl.³ .............................................. H03L 7/26
[52] U.S. Cl. .......................................... 331/94.1; 331/3
[58] Field of Search .................................... 331/3, 94.1

[56] References Cited

U.S. PATENT DOCUMENTS

| 3,038,126 | 6/1962 | Robison | 331/3 |
| 3,242,423 | 3/1966 | Malnar | 331/3 X |
| 3,798,565 | 3/1974 | Jechart | 331/3 X |

*Primary Examiner*—Siegfried H. Grimm

*Attorney, Agent, or Firm*—Allegretti, Newitt, Witcoff & McAndrews, Ltd.

[57] ABSTRACT

The atomic frequency standard comprises a source of light of a given spectral component, comprising a lamp 2 and an isotopic filter 3. The light arriving in an Rb 87 cell 4 empties the hyperfine level $F=1$ by optical pumping. Microwave excitation produced by a loop 5 causes the atoms which populated the level $F=2$, $m_F=0$, to fall back to the level $F=1$, $m_F=0$. Filling of the latter level reduces the transparency of the cell 4, which phenomenon is detected by a photoelectric cell 6 and permits tuning of the microwave excitation to the hyperfine transition frequency. The electromagnetic wave produced by the loop 5 is progressive, which, by the Doppler effect, increases the width of the absorption line of the cell. This increase makes it possible to reduce the control time constant and consequently makes it possible to have a compact frequency standard, with a rapid control action, which can operate in an unfavorable environment.

10 Claims, 3 Drawing Figures

ATOMIC FREQUENCY STANDARD HAVING MICROWAVE LOOP AROUND ABSORPTION CELL

BACKGROUND OF THE INVENTION

The present invention relates to atomic frequency standards and more particularly concerns an optical-pumping atomic frequency standard having a low control time constant.

Atomic frequency standards of the optical pumping type are well known. As shown in FIG. 1, they essentially comprise an optical pumping device 10 incorporating a light detector 24, a quartz oscillator 12 and an electronic system 14 for deriving from the oscillator a high frequency wave which is applied to the device 10 and for comparing the resonance frequency of the atomic system to that of the oscillator for controlling the oscillator.

In the device 10, optical pumping causes a reversal in population between the hyperfine levels of the ground state of atoms which are generally those of an alkali metal such as potassium, sodium or rubidium. In the case of a rubidium (Rb)-type frequency standard, one conventional optical pumping assembly is constructed as follows. A cell 16 which is subjected to a constant magnetic field contains the Rb 87 isotope, the spectrum of which comprises the two hyperfine components A and B. The cell is illuminated by a rubidium 87 lamp 18 through a filter 20 which contains the isotope Rb 85, the absorption spectrum of which comprises the hyperfine components a and b. The components A and a are virtually coincident, while the components B and b are completely separated. The component A of the emission spectrum of the lamp 18 is thus eliminated by the filter 20 so that the light which reaches the cell 16 is formed for the major part by the line B. Only the atoms of Rb 87 of the cell 16, which are in the lower hyperfine level (F=1), absorb light and are raised into higher states. They return by spontaneous emission either to the higher hyperfine level (F=2) or to the lower hyperfine level. As the atoms are immediately excited by the arrival of the light, the lower level (F=1) empties, to the benefit of the higher level (F=2). There is therefore a reversal in respect of the population as between those two levels and accordingly the cell 16 becomes virtually transparent to the radiation from the lamp 18. The cell 16 is disposed in a microwave cavity 22 which is excited at a frequency close to 6835 MHz, corresponding to the energy gap between the hyperfine levels $F=1$, $m_F=0$ and $F=2$, $m_F=0$, which causes the hyperfine transition, accompanied by a stimulated emission of electromagnetic radiation between those two levels. As soon as the atoms which participate in the stimulated emission arrive at the lower hyperfine level (F=1), they are optically pumped and raised into the excited states. The greater the number of stimulated transitions, the greater the amount of light absorbed in the cell, while the smaller the amount of light arriving at a photoelectric cell 24, the lower is the current in the photoelectric cell 24. The photoelectric current passes through a minimum when the frequency of the cavity excitation signal is exactly equal to the transition frequency.

The walls of the cell are advantageously covered with a layer which is referred to as a "non-disorienting" layer and which is intended to eliminate the spin disorientation of the atoms when they come into contact with the walls. The non-disorienting layer makes it possible substantially to increase the duration of interaction of the atoms of the cell with the microwave field and thus makes it possible to have a narrow line of absorption of light in the cell 16.

The quartz oscillator 12 produces a 5 MHz signal which is modulated in a phase modulator 26 at a relatively low frequency (typically of the order of 100 Hz) produced by a low frequency oscillator 28. The modulated signal is applied to a multiplier 30 to produce a signal at the frequency of the stimulated emission, of 6835 MHz. It is this signal which is used to excite the microwave cavity 22.

The signal produced by the photoelectric cell 24 is amplified at amplifier 32 and then applied to a synchronous detector of phase comparator 34 which also receives a signal from the generator 28 so as to effect synchronous detection, making it possible to detect whether the carrier frequency of the signal applied to the cavity 22 is properly centered on the frequency of the hyperfine transition (6835 MHz). Any displacement results in an error signal at the output of the phase comparator 34. This signal is applied to an integrator 36 and then used to control a variable capacitor 38 which is coupled to the oscillator 12 and which modifies the frequency thereof so as to maintain the harmonic of the quartz oscillator centered on the frequency of the hyperfine transition of rubidium.

Frequency standards of the above-described type are systematically designed to achieve the maximum possible levels of performance in regard to stability. The width of the absorption line is therefore relatively small (of the order of 300 Hz), which makes it necessary to use relatively low modulation frequencies (generally less than 200 Hz). The immediate consequence of this low-frequency modulation is that the control time constant is relatively high (generally more than 100 milliseconds).

BRIEF SUMMARY OF THE INVENTION

A broad object of the present invention is to provide a frequency standard having a control time constant which is substantially less than that of the above-described standards, so as to have a frequency stability which, while not attaining that of high-performance standards, is nonetheless entirely sufficient for uses in an unfavorable environment where vibration or shock can occur, or in areas such as navigation and communications.

Reduction in the control time constant, by using a relatively high modulation frequency, must involve an increase in the width of the absorption line. It should be pointed out that an increase in the width of the emission line could be achieved by eliminating the "non-disorienting" layer which covers the walls of the cell. However, this solution cannot be employed as it would lower the signal-noise ratio to an unacceptable value.

The object of the present invention is therefore more specifically to provide a compact and practical frequency standard, with a rapid control action, which can operate in an unfavorable environment. An atomic frequency standard according to the invention comprises an optical pumping device having a source of light of a given spectral component, a cell containing an alkali metal in gas form which is disposed to receive the light and which is internally covered with a non-disorienting layer means for detecting the light transmitted by the cell and producing a detection signal representing the transmission and means for applying a substantially constant magnetic field to the cell; an arrangement for subjecting the cell to an electromagnetic wave inducing a hyperfine spectral transition of the atoms of the metal, which increases the absorption of the light by the cell; and control means responsive to the variations in the detection signal for modifying the frequency of the said wave so as to center it substantially on the frequency of the hyperfine spectral transition, the said arrangement being such as to produce a progressive electromagnetic wave so as to widen the line of absorption of the cell by the Doppler effect in order to permit a reduction in the control time constant.

BRIEF DESCRIPTION OF THE DRAWING

The invention will be described in more detail, by way of example, with reference to the accompanying drawing in which.

DETAILED DESCRIPTION OF THE PREFERRED EMBODIMENT

Figure 2:
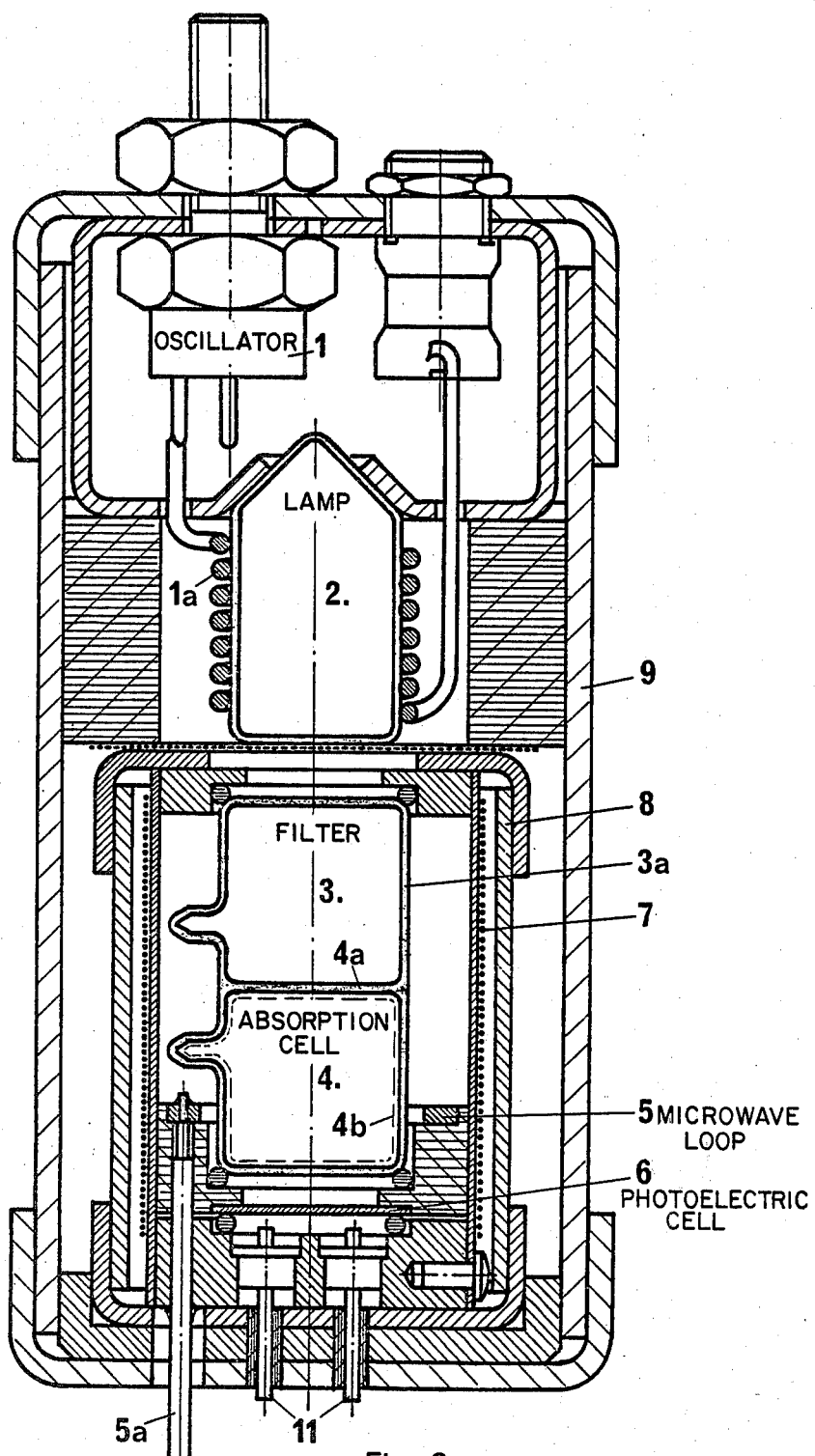
FIG. 2 is a view in cross-section of an illustrative embodiment of a frequency standard embodying the invention.

Referring now to the FIG. 2 embodiment, a radio-frequency oscillator 1 supplies the excitation coil 1a of a lamp 2. The lamp 2 essentially contains Rb 87 and argon at a pressure of 2 torr (0.27 kPa), serving as a starter gas. Disposed opposite the lamp 2 is a filter 3 formed by a cell 3a in which there is Rb 85 and a buffer gas, namely argon at a pressure of 50 torr (6.67 kPa). The purpose of the latter gas is to widen and displace the absorption band of the filter 3.

Disposed on the axis formed by the lamp 2 and the filter 3 is an absorption cell 4. In the illustrative embodiment shown, the absorption cell 4 forms a unitary construction with the filter 3, being separated therefrom only by the wall 4a. The cell 4 is covered with a "non-disorienting" layer 4b. The layer 4b may advantageously be an organo-silane derived from dichlorodimethyl-silane which is commercially available under the name of Dry Film (General Electric), or a silicone, polyethylene or deuterium-bearing polyethylene $(CD_2)_n$.

A microwave loop 5, whose plane is perpendicular to the lamp-cell axis, is disposed around the cell 4. Facing the cell and disposed perpendicularly to the lamp-cell axis, is a photoelectric cell 6. A coil 7 which is disposed around the assembly comprising the filter 3 and the cell 4 generates a constant magnetic field within the cell 4.

Magnetic screens 8 and 9 isolate the filter 3, the cell 4 and the lamp 2 from the influence of external magnetic fields.

Figure 1:
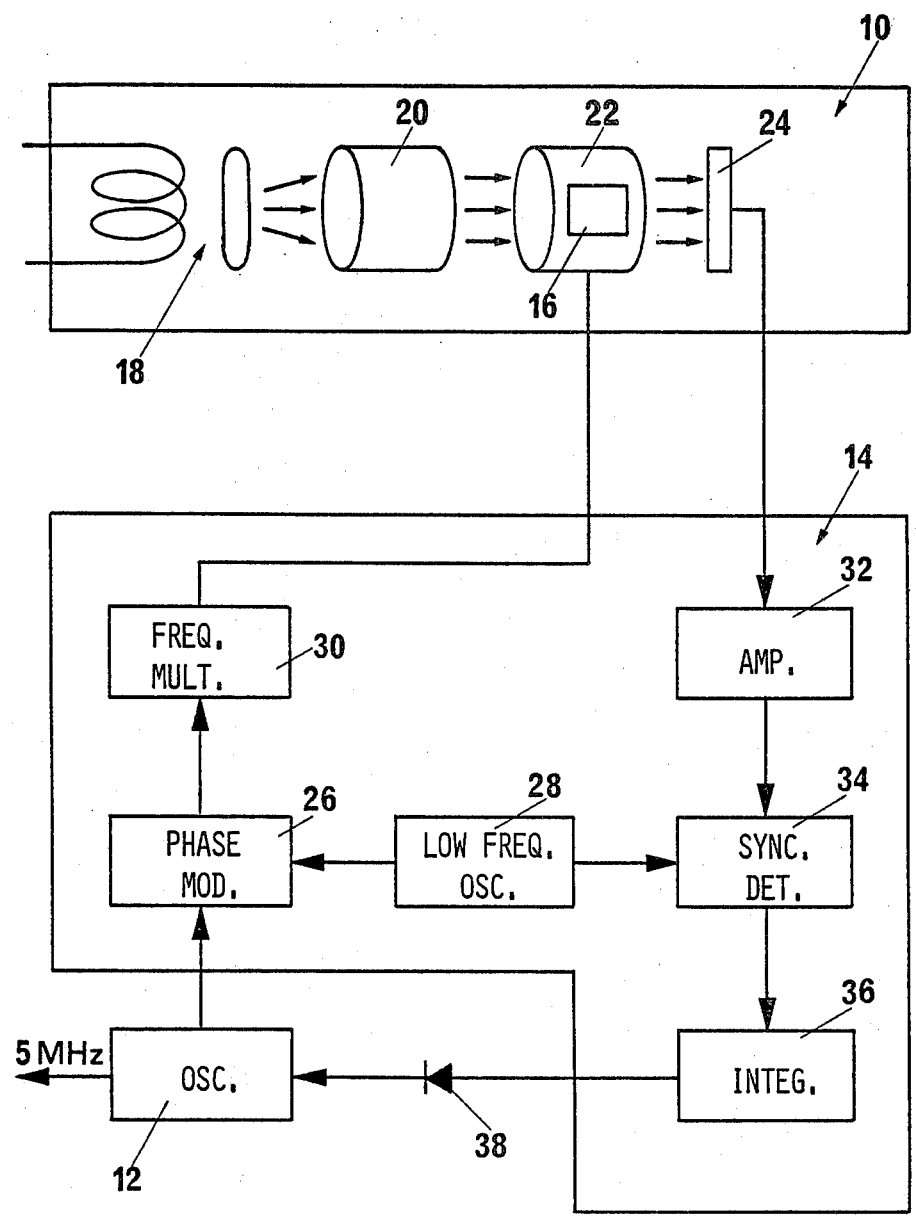
FIG. 1, which has been described above, shows a known frequency standard.

A microwave input 5a provides a feed to the loop 5. The loop 5 may also comprise an SRD diode in series (step recovery diode) which can be supplied at a relatively low frequency. The purpose of the diode is to multiply the frequency in the loop 5, which permits miniaturization of the electric system. Finally, the photoelectric cell 6 is connected to the electronic control system 14 of FIG. 1 by output leads 11.

The frequency standard embodying the invention operates in the following manner:

As in the conventional arrangement, the lamp 2 emits light containing the spectral components A and B. As the component A is filtered by the filter 3, only the component B reaches the Rb 87 cell 4. As in the conventional arrangement, it empties the hyperfine level $F=1$ by optical pumping. As in the conventional arrangement, 6835 MHz microwave excitation caused by the loop 5 causes the atoms of Rb 87 which populated the hyperfine level $F=2$, $m_F=0$, to fall back to the level $F=1$, $m_F=0$. Filling of the latter level reduces the transparency of the cell 4, which phenomenon is detected by the cell 6, permitting tuning of the microwave excitation to the hyperfine transition frequency.

In a known Rb 87 frequency standard, the cell is disposed in a microwave cavity. The electromagnetic wave is stationary and the atoms see a field at constant phase. There is therefore no increase in width of the absorption line by the Doppler effect. The absorption line has a typical width of about 300 Hz, which, for detection, makes it necessary to use low modulation frequencies (typically 137 Hz). The direct consequence of this low frequency modulation is a relatively high control time constant (more than 100 milliseconds).

Figure 3:
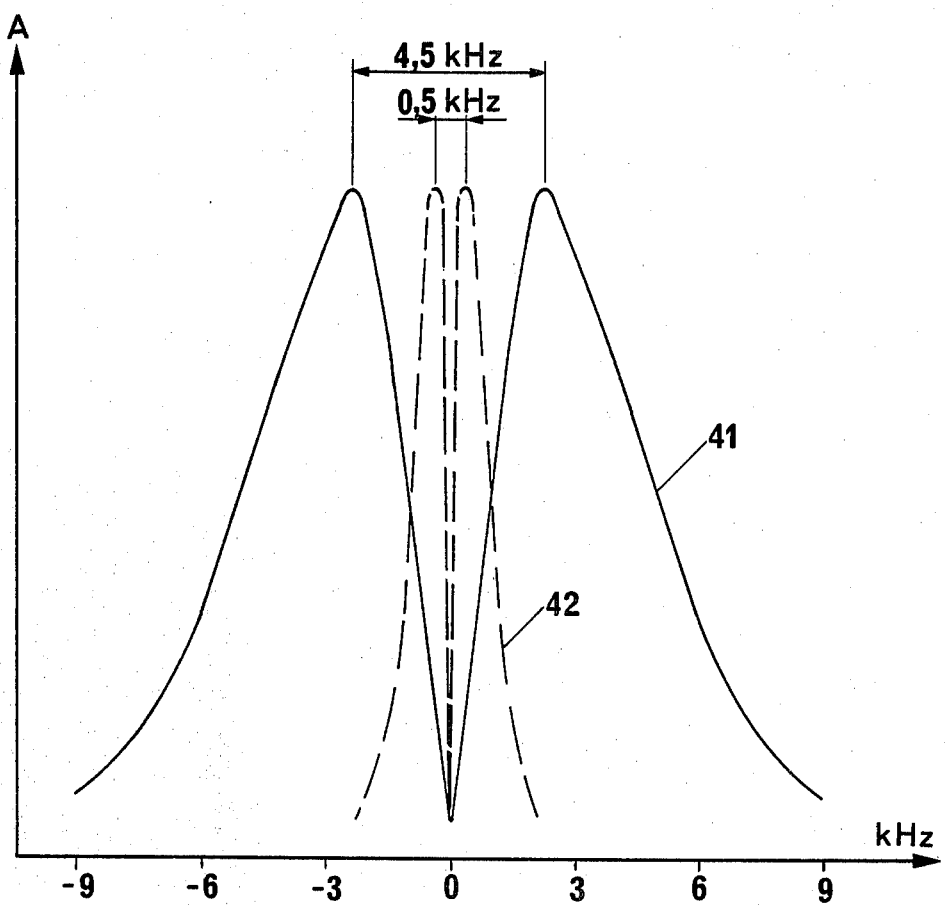
FIG. 3 shows the absorption line of a device according to the invention, compared to that of a known standard.

In the above-described frequency standard of FIG. 2, the cell is subjected to a progressive electromagnetic wave emitted by the loop 5. The atoms of the cell are no longer subjected to an electromagnetic field at constant phase, but, in contrast, to a variable-phase field. The result of this is that the line of absorption of the cell is increased in width by the Doppler effect. The width of the absorption line is then typically 4.5 kHz, which permits a modulation frequency higher than 1 kHz. The control time constant can go down to about 1 millisecond. FIG. 3 shows the wider line 41 of the above-described progressive-wave device, as compared to the normal line 42 of a known device.

Experimental tests have shown that the long-term drift of such a progressive-wave frequency standard is less than $1 \times 10^{-11}$/month. However, the signal-to-noise ratio remains favorable and is typically 3,000. The frequency stability (measured ALLAN variance) is typically $\sigma y(\tau) = 1 \times 10^{-10} \cdot \tau^{-\frac{1}{2}}$, for $1 \leq \tau \leq 500$ seconds.

The progressive-wave system according to the invention also has, besides the low control time constant, the following advantages:

(1) The elimination of the microwave cavity and the replacement thereof by a loop makes it possible substantially to reduce the volume of the absorption cell, for example to 1 cm$^3$ whereas the volume of the known systems is 50 cm$^3$. Miniaturization is an essential quality for uses such as aerial and space navigation, telecommunications and so on.

(2) The elimination of the microwave cavity eliminates the necessity to tune the cavity and the cell, which greatly simplifies the production of rubidium-type frequency standards and reduces the high rate of rejection of known devices.

(3) A loop is much easier to produce than a microwave cavity.

The use of a "non-disorienting" layer ensures an output frequency which is more reproducible. The reproducibility of a standard of the above-described type, having a cell with a volume of 1 cm$^3$, is $5 \times 10^{-8}$, whereas a conventional standard which does not use a "non-disorienting" layer but a buffer gas has a reproducibility of $1 \times 10^{-6}$. These better levels of performance make it possible to use a simpler frequency synthesizer.

It will be apparent to those skilled in the art that the effect of a progressive wave occurs only for a cell with atoms in movement, that is to say, with walls which are covered with a "non-disorienting" layer, and not for a buffer gas-type cell in which the atoms are virtually motionless.

Finally, it will be clear that the simple microwave loop 5 described in the above example may be replaced by any arrangement which makes it possible to provide a progressive wave producing the increase in the width of the absorption line and consequently a reduction in the control time constant.

While there is shown and described one preferred illustrative embodiment of the invention, it will be understood by those skilled in the art that other modifications may be made within the principles of the invention and the scope of the appended claims.

What is claimed is:

1. An atomic frequency standard comprising an optical pumping device comprising a source of light of a given spectral composition, a cell containing an alkali metal in gas form which is disposed to receive said light, means for detecting the light transmitted by the cell and producing a detection signal representing the transmission of the light; and means for applying a substantially constant magnetic field to the cell; an arrangement for subjecting the cell to an electromagnetic wave inducing a hyperfine spectral transition of the atoms of the metal, which increases the absorption of the light by the cell; and control means responsive to the variations in the detection signal for modifying the frequency of the said wave so as to center it substantially on the frequency of the hyperfine spectral transition, the improvement wherein (1) said cell lacks a buffer gas and is internally covered with a non-disorienting layer; and
(2) said arrangement produces a progressive electromagnetic wave widening the line of absorption of the cell by the Doppler effect in order to permit a reduction in the control time constant.

2. The atomic frequency standard of claim 1, wherein the said arrangement comprises a loop.

3. The atomic frequency standard of claim 1, wherein the said arrangement comprises a loop and an SRD diode connected in series with the loop.

4. The atomic frequency standard of claim 1, wherein the non-disorienting layer comprises polyethylene.

5. The atomic frequency standard of claim 1, wherein the non-disorienting layer comprises an organo-silane.

6. The atomic frequency standard of claim 1, wherein the non-disorienting layer comprises a silicone.

7. The atomic frequency standard of claim 1, wherein the source of light of the given spectral component comprises an alkali metal vapour lamp, lamp excitation means and an isotopic filter.

8. The atomic frequency standard of claim 7, wherein the lamp is an Rb 87 lamp, the filter comprises an Rb 85 cell, and wherein the cell containing an alkali metal in gaseous form is an Rb 87 cell.

9. The atomic frequency standard of claim 7, wherein the isotopic filter and the cell containing an alkali metal form a unitary assembly.

10. The atomic frequency standard of claim 8, wherein the isotopic filter and the cell containing an alkali metal form a unitary assembly.

* * * * *